(12) United States Patent
Fredeman et al.

(10) Patent No.: US 11,449,397 B2
(45) Date of Patent: Sep. 20, 2022

(54) CACHE ARRAY MACRO MICRO-MASKING

(71) Applicant: INTERNATIONAL BUSINESS MACHINES CORPORATION, Armonk, NY (US)

(72) Inventors: Gregory J. Fredeman, Wappingers Falls, NY (US); Glenn David Gilda, Binghamton, NY (US); Thomas E. Miller, Poughkeepsie, NY (US); Arthur O'Neill, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 485 days.

(21) Appl. No.: 16/567,308

(22) Filed: Sep. 11, 2019

(65) Prior Publication Data

US 2021/0073087 A1 Mar. 11, 2021

(51) Int. Cl.

| | |
|---|---|
| *G06F 11/00* | (2006.01) |
| *G06F 11/20* | (2006.01) |
| *G06F 12/0875* | (2016.01) |
| *G06F 11/16* | (2006.01) |
| *G11C 29/30* | (2006.01) |
| *G06F 11/10* | (2006.01) |
| *G11C 29/04* | (2006.01) |

(52) U.S. Cl.
CPC ...... *G06F 11/2017* (2013.01); *G06F 11/1064* (2013.01); *G06F 11/1666* (2013.01); *G06F 12/0875* (2013.01); *G11C 29/30* (2013.01); *G06F 2212/70* (2013.01); *G11C 2029/0401* (2013.01)

(58) Field of Classification Search
CPC ............ G06F 11/2017; G06F 11/1064; G06F 11/1666; G06F 11/073; G06F 11/27; G06F 11/273; G06F 12/0875; G06F 2212/70; G11C 29/30; G11C 2029/04
See application file for complete search history.

(56) References Cited

U.S. PATENT DOCUMENTS

| | | |
|---|---|---|
| 6,418,066 B1 | 7/2002 | Hidaka |
| 2004/0057304 A1 | 3/2004 | Smits |
| 2007/0005999 A1 | 1/2007 | Rusu |

(Continued)

OTHER PUBLICATIONS

Transmittal Form PTO/SB/21, filed Mar. 18, 2020.
Transmittal Form PTO/SB/21 signed May 25, 2020.

*Primary Examiner* — Joseph D Manoskey
(74) *Attorney, Agent, or Firm* — Cantor Colburn LLC; Erik Johnson (57) ABSTRACT

A computer-implemented method for memory macro disablement in a cache memory includes identifying a defective portion of a memory macro of a cache memory bank. The method includes iteratively testing each line of the memory macro, the testing including attempting at least one write operation at each line of the memory macro. The method further includes determining that an error occurred during the testing. The method further includes, in response to determining the memory macro as being defective, disabling write operations for a portion of the cache memory bank that includes the memory macro by generating a logical mask that includes at least bits comprising a compartment bit, and read address bits.

25 Claims, 9 Drawing Sheets

(56) References Cited

U.S. PATENT DOCUMENTS

| | | | |
|---|---|---|---|
| 2011/0320862 A1* | 12/2011 | Blake | G11C 29/883 |
| | | | 714/E11.169 |
| 2013/0080847 A1* | 3/2013 | Zorian | G06F 30/3312 |
| | | | 714/E11.169 |
| 2013/0212449 A1* | 8/2013 | O'Connell | G06F 11/10 |
| | | | 714/764 |
| 2016/0239375 A1 | 8/2016 | Fee | |
| 2016/0239378 A1* | 8/2016 | Blake | G06F 30/39 |

* cited by examiner

CACHE ARRAY MACRO MICRO-MASKING

BACKGROUND

The present invention generally relates to computer technology, and particularly to cache memory, specifically on-processor chip cache memory devices such as embedded dynamic access memory (EDRAM).

Conventionally, redundancies in EDRAM macros and EDRAM macro sparing may be employed to circumvent a limited number of defects within a cache memory. The redundancies may be formed as spare portions within the cache memory which may be accessed through arranged circuitry. Thus, if portions of a cache memory are defective, particularly within an EDRAM macro, a portion of the redundancies may be utilized to replace the defective portions. However, if the available spare portions for the cache memory are all utilized and subsequent defects exist, the cache memory cannot be used and must be discarded.

Another conventional solution for such a technical problem with EDRAM macros includes array masking, which may be employed to circumvent defects or cache errors within a cache memory of a computer system. Array masking, in general, is an identification of the defects or the cache errors (e.g., correctable and uncorrectable errors) as part of a diagnostic test of the computer system to bring the computer system online, followed by a marking of portions of the cache memory that are unusable due to uncorrectable errors. If an error is identified by the diagnostic testing and no redundant locations are available for the error location, then a masking bit is enabled for a portion of the cache memory associated with the uncorrectable error so that when the computer system is running, that corresponding portion is not used. However, conventional array masking due to this diagnostic, mark, and run approach may significantly impact system performance due to loss of overall cache capacity. It may also impact the ability to hide certain errors if the mask does not cover common EDRAM macro fail mechanisms.

SUMMARY

A computer-implemented method for memory macro disablement in a cache memory includes identifying a defective portion of a memory macro of a cache memory bank. This portion is selectable by a compartment bit and one or more read address bits. The method includes iteratively testing each line of the memory macro, the testing including attempting at least one write operation at each line of the memory macro. The method further includes determining that an error occurred during the testing. The method further includes, in response to determining the memory macro as being defective, disabling write operations for a portion of the cache memory bank that includes the memory macro by generating a logical mask that includes at least bits comprising a compartment bit, and one or more read address bits.

The testing can be part of an Array Built-in Self-Test (ABIST). In one or more examples, the method can include determining that an error overflow exists for the memory macro, and responsively activating a redundant circuit within the memory macro.

In one or more examples, disabling write operations includes outputting the logical bit mask to least recently used (LRU) selection logic of the cache memory.

In one or more examples, the logical mask is used to select a half of the cache memory bank based on the compartment bit and to select a subarray group within the selected half of the cache memory bank based on the one or more predetermined address bits.

The above described features can also be provided at least by a system, a computer program product, and a machine.

According to one or more embodiments of the present invention, a computer-implemented method for memory macro disablement in a cache memory includes detecting a failure in a memory macro in a cache memory bank. The cache memory bank can be divided into multiple rows of a plurality of memory macros. The method further includes, in response to determining the memory macro as being defective, disabling write operations for a portion of the cache memory bank that includes the memory macro by generating a logical mask that comprises at least: a compartment bit, and one or more read address bits.

In one or more examples, the logical mask selects a half of the cache memory bank based on the compartment bit, selects a subarray group within the selected half of the cache memory bank based on the one or more predetermined address bits.

The above-described features can also be provided at least by a system, a computer program product, and a machine, among other types of implementations. The features described herein improve performance and allows masking of failures/defects in cache memory. Further, the cache micro-masking features described herein can be used with array built-in self-test (ABIST) compares to correlate ABIST test results to system functional mode masks. Features described herein facilitate a cache controller, or any other control circuit to use a "compartment bit" (which is a bit value) to select a subarray grouping through read inputs so that a system level masking can hide a subarray failure. Additionally, one or more embodiments of the present invention use an address bit as a new mask selector to reduce the amount of cache taken offline, i.e. "micro-masking". In addition, one or more embodiments of the present invention facilitate a further improvement to computing technology, particularly, cache memory circuits by enabling power saving when accessing subsequent interleaves by selecting a subarray grouping when reading data from the cache.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Embodiments of the present invention facilitate macro disablement in a cache memory array. If a cache memory chip includes errors or defects, example embodiments disable the defective portions of the cache memory to circumvent the defects. Disablement is provided using "micro-masking" for removing from use one or more portions of the cache memory. The disablement is provided such that operation of the cache memory is relatively unaffected even with defective portions disabled.

Existing solutions that provide such disablement of portions of the cache memory are optimized for cache usage. Typically, a portion of system address bits is used to start a read access to macro. Further, directory compares identify a compartment, with results of the directory compare generating late selects (LS). One LS or compartment bit selects between macro halves with distinct input-output (IO) blocks. Also, subarrays exist in each macro half and are a relatively common failure point. In existing solutions, a macro half can be taken offline using a masking function that allows a computer system using the cache memory to tolerate a subarray failure by preventing access to that macro half.

However, technical challenges exist with available solutions. For example, improvements in cache density, has resulted in a subarray macro that now spans both halves of the macro instead of being unique for each macro half. As a result, masking a macro half no longer is effective for hiding a subarray failure. Additionally, it is desirable to reduce the amount of cache being taken offline through masking. Existing macro half masking causes the amount of cache taken offline to scale with cache size.

Embodiments of the present invention address such technical challenges and facilitate cache memory masking by facilitating a "compartment bit", which is a control bit value, to select a subarray grouping through read inputs so that system level masking can hide a subarray failure. A predetermined address bit (e.g., address bit #21, 31, 43, or any other) is instead used to select between upper and lower array macro halves. Another address bit can be used as a new mask selector to reduce the amount of cache taken offline, i.e., "micro-masking". Further, one or more embodiments of the present invention facilitate saving power being consumed when accessing subsequent interleaves (ILVs) by selecting a subarray grouping when reading. To this end, one or more embodiments of the present invention provide macros that change subarray groupings using two bits to select subarray grouping. This provides an ability to select a subarray with masking for a subarray failure.

In this manner, one or more embodiments of the present invention facilitate masking denser cache memory arrays than those being used in existing solutions, for example, instead of masking 1/32nd of the cache, one or more embodiments of the present invention can mask 1/64, which improves performance and allows masking of failures/defects in the cache memory. In one or more embodiments of the present invention, the cache micro-masking can be used with array built-in self-test (ABIST) compares.

Figure 1:
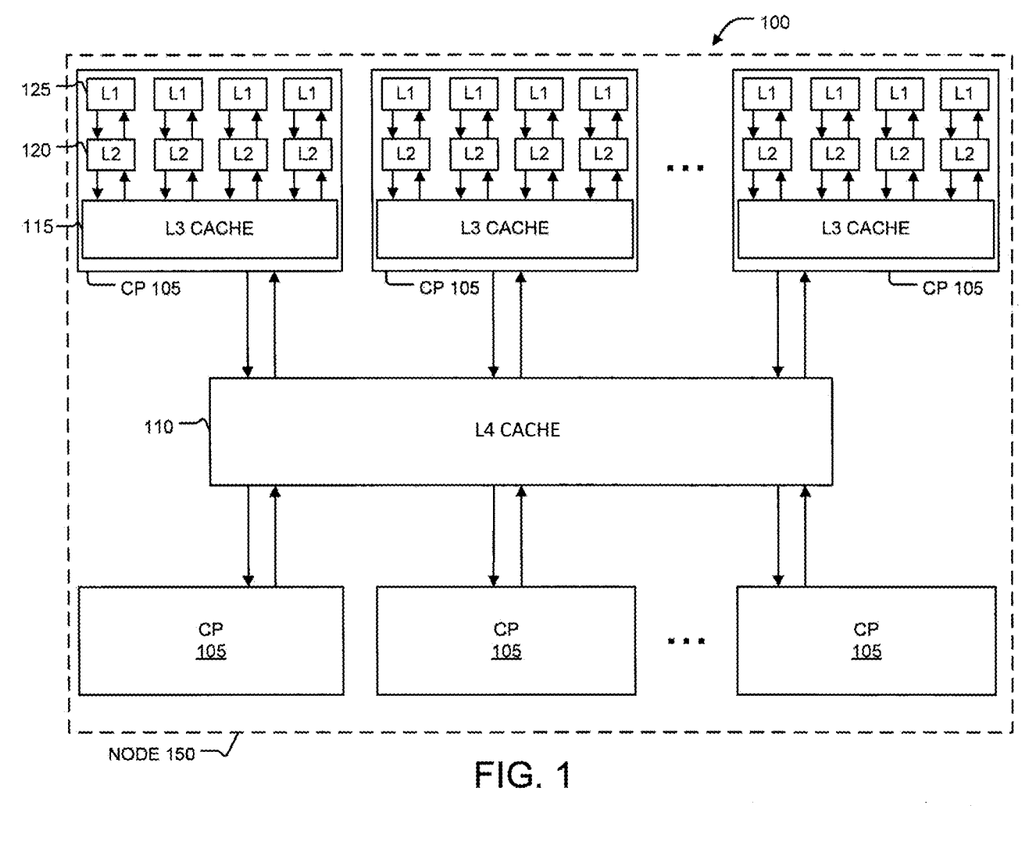
FIG. 1 illustrates a cache topology according to one or more embodiments of the present invention.

FIG. 1 illustrates a cache topology 100 according to one or more embodiments of the present invention. FIG. 1 illustrates a set of central processors (CP) 105 (e.g., central processing units or processing circuits) operatively connected via busses to one or more L4 caches 110. It is understood that the number of CPs depicted in FIG. 1 is according to one example, and that in other embodiments of the present invention the cache topology 100 can include a different number of CPs 105. Although not shown in FIG. 1, each of the central processors 105 includes one or more cores which may perform reading and executing of instructions. On each central processor 105, the multiple cores may be operatively connected via busses to the L1, L2, and L3 caches 125, 120, and 115. The L1 caches 125 are physically closest to the cores, with the L2 caches 120 and the L3 caches 115 successively further from the cores. It is understood that the designation of caches may be reversed. Although the L3 and L4 caches 115 and 110 may include embedded dynamic random access memory (DRAM) which is referred to herein as EDRAM, it should be understood that any other type of suitable memory, such as SRAM, may be utilized. The central processors 105 operatively connected to the L4 caches 110 (e.g., two L4 caches) form a node 150. In a computing system, a plurality of nodes 150 may be operatively connected to one another for communications such as making and responding to requests, or any suitable operation.

Each individual central processor 105 may be fabricated on a separate chip, which may include the L1, L2, and L3 caches 125, 120, and 115. The L4 cache 110 may be fabricated on a separate chip, or a combination of separate chips. According to example embodiments of the present invention, the L4 cache 110 is formed on two (2) separate chips. It is understood that the separation of the chips that is described is one possible example, and that in other embodiments of the invention, the separation of the chips may be different. For example, there may be a single chip for L4 cache. Fabrication of the chips (including integrated circuits, wires, metal layers, semiconductor and/or other material components) may be facilitated through lithography and/or other suitable techniques. The fabrication process may include various deposition techniques including physical vapor deposition (PVD), chemical vapor deposition (CVD), electrochemical deposition (ECD), molecular beam epitaxy (MBE), atomic layer deposition (ALD) and/or any suitable technique.

Figure 2:
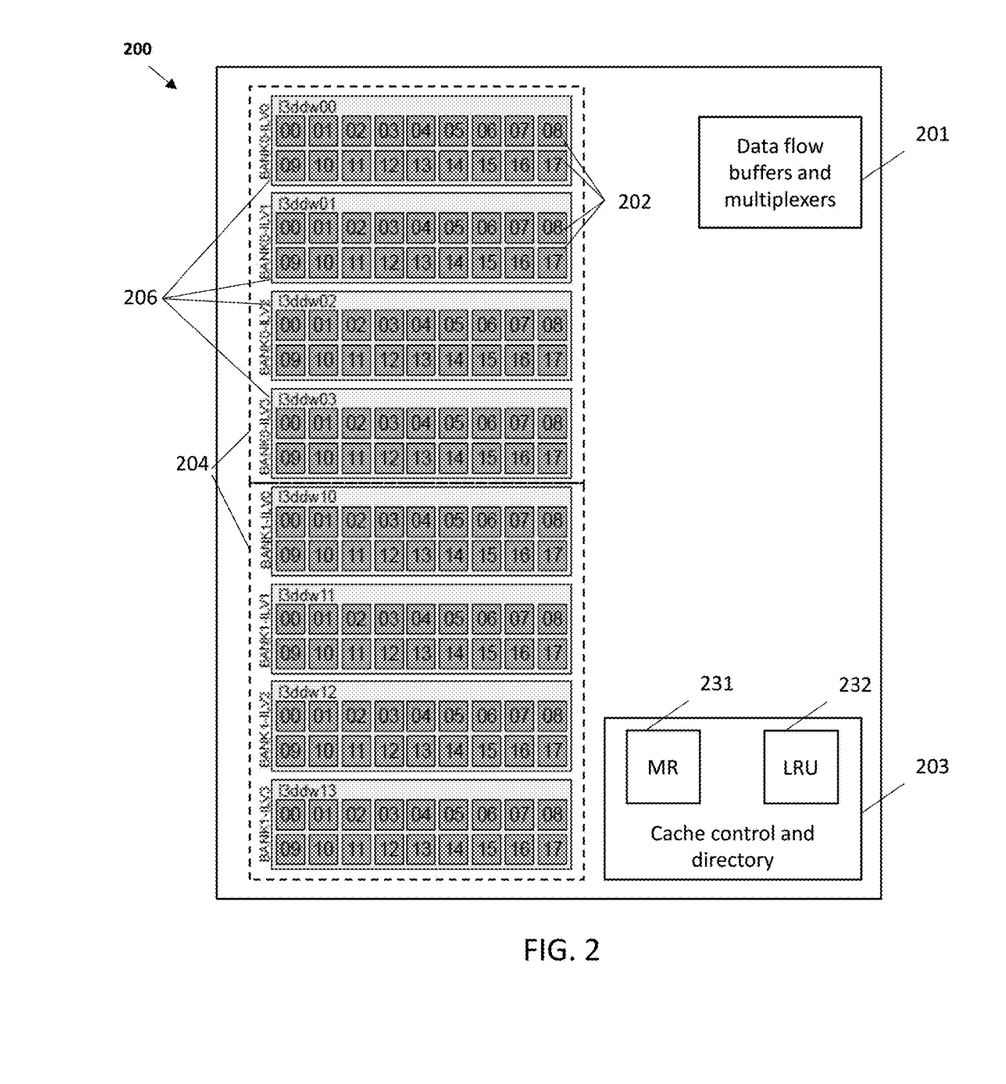
FIG. 2 depicts a logical layout of a portion of an L3 cache according to one or more embodiments of the present invention.

Turning to FIG. 2, a logical layout of a portion of an L3 cache is illustrated. For example, the cache portion 200 may be used for a L3 cache, a L4 cache, or any other type of cache. It should be noted that according to at least one example embodiment, an entire cache includes multiple such cache portions (e.g. 2 portions, 8 portions, etc.), and therefore, a complete example cache can include multiple portions 200. In the depicted example, the cache portion 200 includes two banks (204) each including four interleaves (ILV 206)—ILV0, ILV1, ILV2, and ILV3. It is understood that in other examples, the cache portion 200 can include different number of interleaves and/or banks. Each ILV includes 18 EDRAM macros 202. It is understood that the number of EDRAM macros 202 can be different in other embodiments. Each EDRAM macro 202 has a redundancy for repairing defects.

The cache portion 200 may also include data flow portions 201. The data flow portions 202 may include buffers and multiplexers (not illustrated for the sake of clarity) to facilitate data flow across the L3 cache portion 200.

The cache portion 200 may further include a cache control and directory 203, also referred to as a cache controller 203. The cache control and directory 203 provides control of cache reads/writes. The cache control and directory 203 includes a cache array mask register 231 and least recently used (LRU) selection logic 232.

The cache array mask register 231 may provide a logical mask to the LRU selection logic 232, the logical mask configured to identify a particular set of EDRAM macros 202 to disable a portion thereof.

The LRU selection logic 232 selects an associativity class in which a new cache line is to be installed/written. Through comparison of the logical mask and a bank address, the LRU selection logic 232 can disable write operations to a portion of a particular set of EDRAM macros 202 identified in the logical mask. Detailed description of EDRAM macro disablement is described further.

Figure 3:
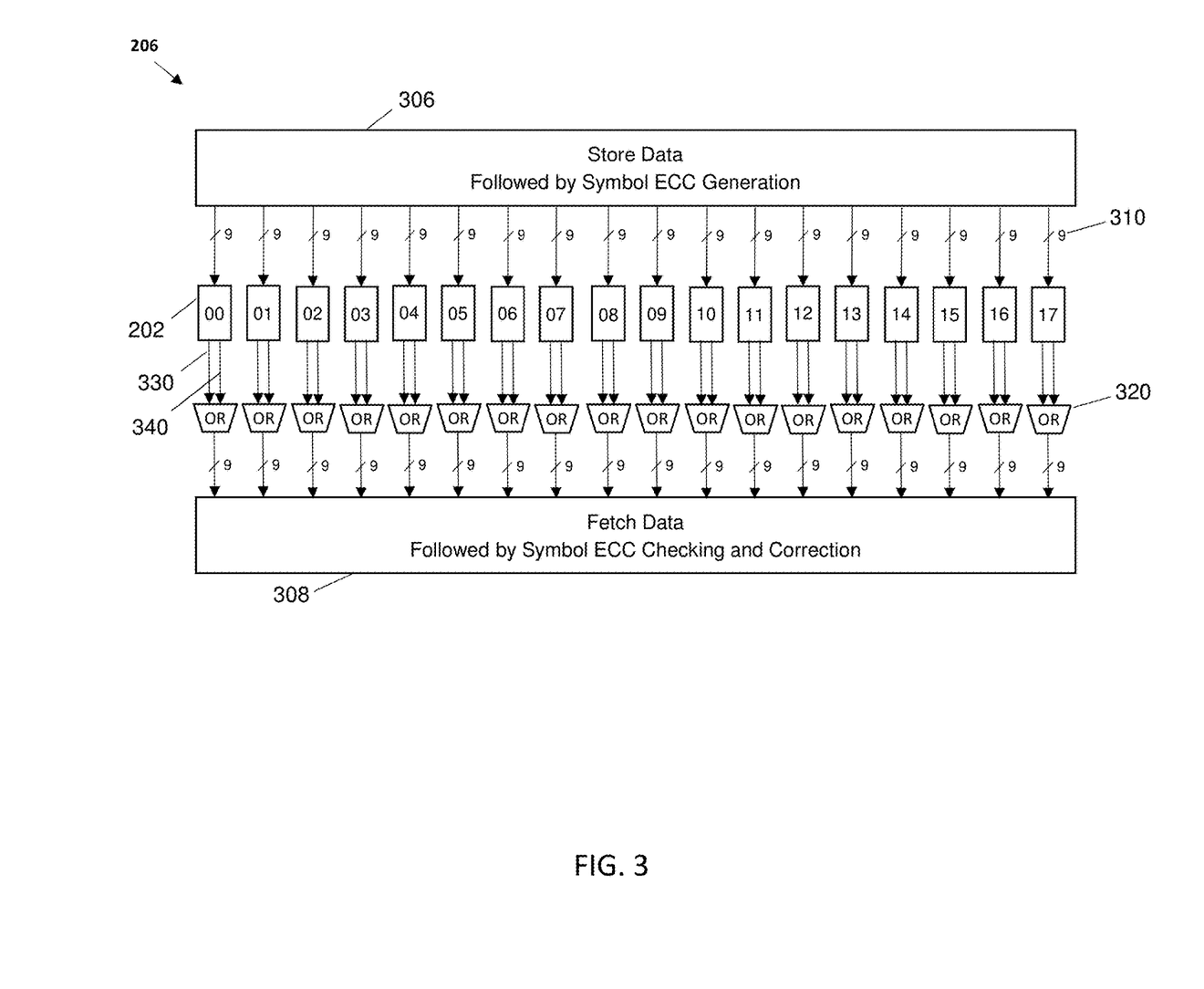
FIG. 3 depicts a logical view of a single cache interleave according to one or more embodiments of the present invention.

FIG. 3 depicts a logical view of a single cache interleave 206 according to one or more embodiments of the present invention. The depicted cache interleave 206 includes multiple EDRAM macros 202 that are logically arranged into a number of columns and a number of rows. As will be understood by those of skill in the art, logical arrangement of EDRAMs 202 into a number of rows and columns mean that the EDRAMs 202 are not necessarily physically arranged into rows and columns within the L3 cache interleave 206, rather are connected and/or indexed in a manner that is representative of rows and columns.

The EDRAM macros 202 individually provide 9 bits of data each from each macro half for an individual access. This 9 bits of data correspond to a 9 bit ECC symbol for providing error correction. A total of 18 symbols provides for single symbol error correction with 3 symbols used as check symbols. The remaining 15 symbols contain 128 bits of data along with 7 extra bits reserved for encoding other error information from other sources in the system.

Each row of EDRAMs 202 may be connected to a staging and storage circuitry 306 that can be used to stage data (i.e., temporarily store data in latches or registers as necessary based on computer cycle-based physical limitations to data transmission), generate ECC protection symbols, and store data and ECC in the EDRAMs 202 in accordance with embodiments of the invention described herein. After staging, store data can be multi-dropped to each row in a cache bank using busses 310, where selective write controls may be used to store data in the desired internal EDRAM row of EDRAMs 202. Not shown in FIG. 3 is a common address bus connected to every EDRAM 202 in each cache bank, where the address bus causes one of the internal EDRAM rows to be selected for access in each row of EDRAMs 202.

According to some embodiments of the present invention, each row of EDRAMs 202 is connected to fetch and error correction circuitry 308 that can be used to fetch data from the EDRAMs 202 and perform error correction functionalities with respect to the data. According to some embodiments of the present invention, OR gates 320 are disposed between each row of EDRAMs, which may be used to deliver fetch data from a desired internal row of EDRAMs 202. Circuitry internal to the EDRAMs 202 select which of the 2 busses 330, 340, coming out of each EDRAM 202 contain data, with the other bus driving zeroes for data.

In a cache memory, electrical or magnetic interference inside a computer system can cause a single bit of the EDRAM to spontaneously flip to the opposite state. This can change the content of one or more memory cells or interfere with the circuitry used to read/write them. Also, the circuitry of the cache may fail, and this can change the content of one or more memory cells.

The cache controller 203 ensures the integrity of data stored in a data processing system and transmitted between various parts of the system using various error detection and correction schemes. An error can be a correctable error (CE) or an uncorrectable error (UE). A single symbol correction scheme employing Reed-Solomon coding may be used to correct any number of bits within a symbol, and a double symbol detection as part of the same coding can be used to alert the system of an uncorrectable error.

Typically, the cache controller 203 makes use of checking multiple ECC words accessed with the same wordline (or subarray or other common regions of logic or arrays) to detect gross errors with a higher degree of detection. This, in turn, is used to protect the data (through a UE indicator, a system checkstop or other means, depending on the needs of the system).

If the cache controller 203 detects a failure in a subarray (shown in FIG. 4), the cache controller 203, uses system bank masking using the cache array mask register 231 to eliminate a portion of the EDRAM macro 202 that contains a subarray, for example, to mask a bad subarray. In existing solutions, such masking was used on a per-bank basis to disable half of the compartments in the cache bank 204. The masking is applied during an array self-built in test (ABIST) or during a functional operation.

However, with improvements in the density of circuits, the cell density in a cache bank has substantially doubled or increased even more, with subarrays in the cache bank 300 sharing one or more circuits such as IO blocks. Accordingly, a technical challenge exists that a subarray failure may not be segregated as it was in the existing solutions, where disabling half of the cache bank disables only a portion of that subarray. Bank masking performed in this manner no longer hides a subarray failure. Further, using such a bank masking scheme when a subarray failure is detected can cause a loss of available cache that grows with increase in cache size.

Accordingly, one or more embodiments of the present invention facilitate the cache controller 203, or any other control circuit to use a "compartment bit" (which is a bit value) to select a subarray grouping through read inputs so that system level masking can hide a subarray failure. Additionally, one or more embodiments of the present invention use an address bit as a new mask selector to reduce the amount of cache taken offline, i.e. "micro-masking". In addition, one or more embodiments of the present invention facilitate a further improvement to computing technology, particularly, cache memory circuits by enabling power saving when accessing subsequent ILV's by selecting a subarray grouping when reading data from the cache.

Figure 4:
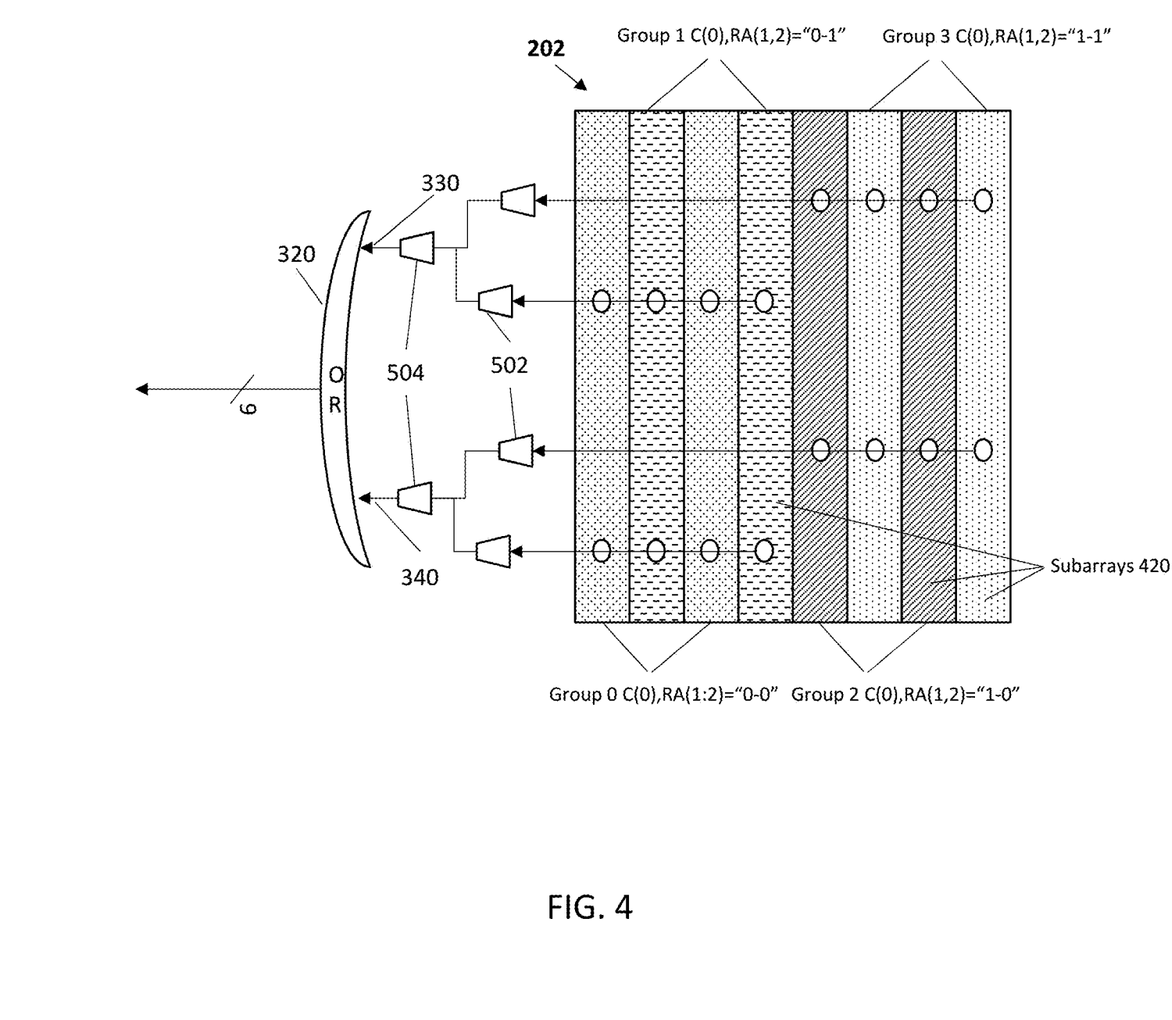
FIG. 4 depicts a block diagram of an EDRAM macro that facilitates hiding subarray failure according to one or more embodiments of the present invention.

FIG. 4 depicts a block diagram of an EDRAM macro 202 that facilitates hiding subarray failure according to one or more embodiments of the present invention. The EDRAM macro 202 includes multiple subarrays 420, eight shown in the example herein. One or more embodiments of the present invention facilitate two subarray groupings based on two read address (RA) bits, say RA(1:2). RA(1:2) can use predetermined system address bit, e.g. 42,43. It should be noted that in other embodiments different bit positions can be used for determining the subarray grouping. In one or more examples, another read address bit, say RA(0), at a predetermined system address location (e.g., 41) can be used generating an ARY_SEL signal for selecting between the upper and lower halves and the RA bits and uppermost compartment bit C(0) bits are further used for selecting the subarray grouping within the selected half. The ability to select a subarray grouping further provides the capability of masking a subarray if it has a defect. It is understood that upper and lower are just one way of dividing the subarrays in the EDRAM macro 202, and that in other examples, the division can be left/right or any other such arrangement. The RA bits are further used to select a subarray group in the selected half. The facility to select a subarray further facilitates masking a subarray failure by the cache controller 203.

The OR gate 320 shown in the FIGS. 3 and 4 may not be part of the EDRAM macro 202 itself, in one or more examples. The blocks 502 select from 1,184 bit lines receiving data from a subarray wordline. This selection is done using a late select decode of 4 compartment bits C(0,2:4), with only 1 of these 2 blocks selected in each upper or lower half, resulting in 74 data lines selected for input to the blocks 504. Two of these 74 data lines comprise data lines employed for redundancy. One of the blocks 504 then performs further selection using C(1), read address bit RA(0) and additional word select bits using additional system address bits, e.g. 58:59, resulting in 9 data bits output from either the upper or lower half of the EDRAM macro 202.

The compartment bit C(0) is used in conjunction with the RA bits for selecting the subarray groupings in the EDRAM macro 202. Until the C(0) bit value is known, both subarray groupings are selected, and blocks 502 perform a late select when the C(0) value is known. If the C(0) value is known (i.e. when accessing subsequent interleaves), only one subarray grouping can be selected, saving power.

Referring to FIG. 4, the possible micro-masking groups of subarrays, groups 1-4, are depicted using similar shading. Using the bit positions described above, the selection of a defected subarray can be performed using a mask that first selects a group and then identifies a subarray within the group. For example, if C(0)=0, the defect is within Group 0 or Group 1. Further, if the bits RA(2)="1", group 1 is selected. RA(1) is not used for masking purposes as shown in this example. It is understood that the above organization and corresponding bits being used are exemplary and that the organization can be different in other examples.

Figure 5:
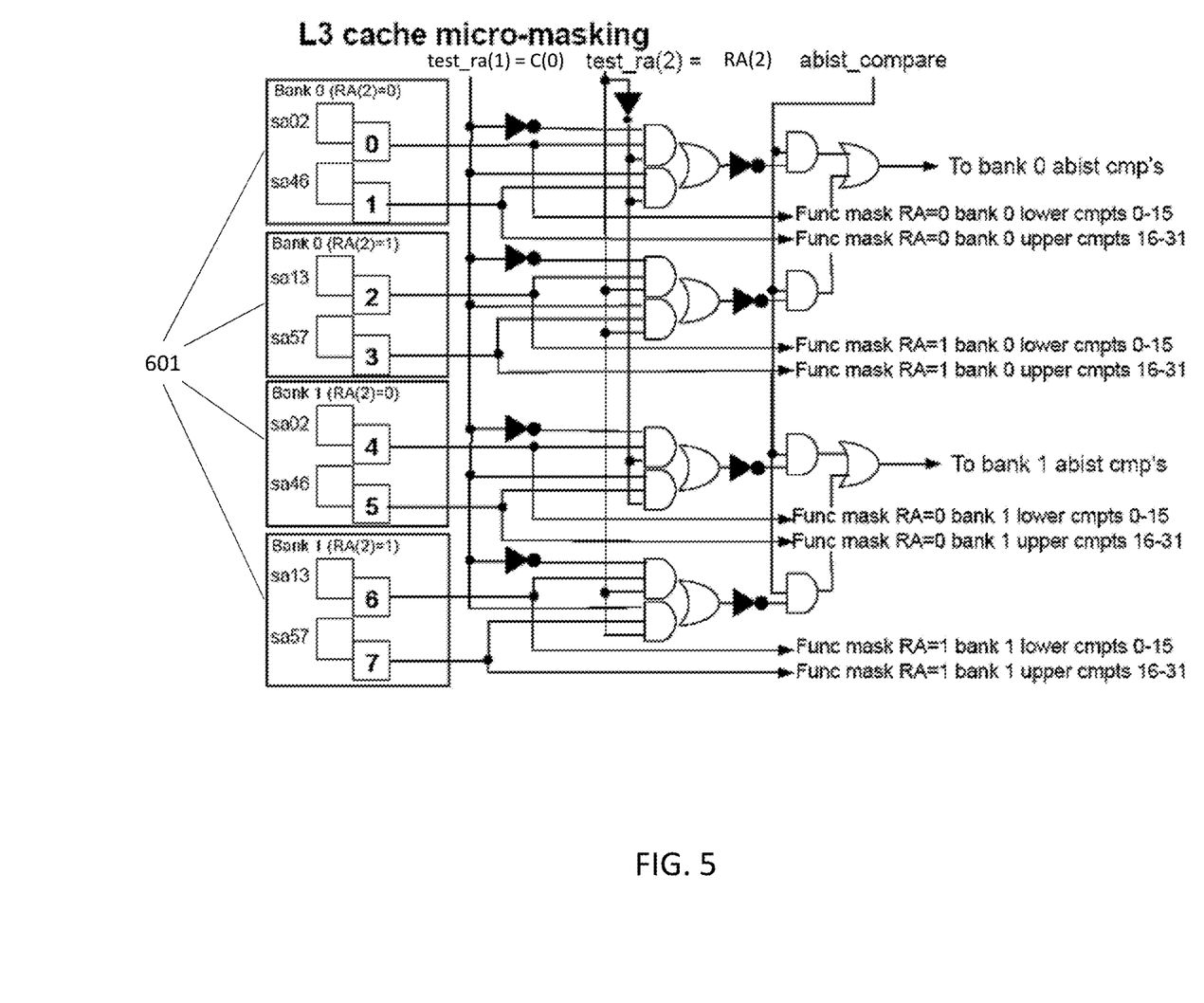
FIG. 5 depicts a micro-masking for a cache according to one or more embodiments of the present invention.

FIG. 5 depicts a micro-masking for a cache according to one or more embodiments of the present invention. FIG. 5 shows a numbering scheme of which subarray groups are selected for masking by each mask bit. For example, SA02 selects subarrays 0 and 2 for masking, which would correspond to group 0 in FIG. 4. SA02 use C(0)=0 and RA(2)=0 for such selection. As shown in FIG. 5, test_ra(0) equals the value of C(0), and test_ra(2) equals the value of RA(2). The selection made in this manner is disabled for use in the cache. Accordingly, system-level masks can be applied on a per-bank basis to take half of the compartments offline for a given portion of a bank selected by the system address corresponding to RA(2). The masking can be applied to compare operations during ABIST diagnostic testing, or to functional operation of the cache while the system is running. Here, a set of latches 601 are used to provide the masking bits for selecting the specific portion of the cache. The specific portion that is selected for masking is the defective portion of the cache that is identified using one or more known techniques, as described herein. By masking the specific portion, data is not written/installed to the selected portion according to the mask. The set of latches, in one or more examples, generates the mask according to the cache array mask register 231. While this example shows the same set of latches used for masking both in abist and functional modes, a separate set of latches can be used for each mode.

Figure 6:
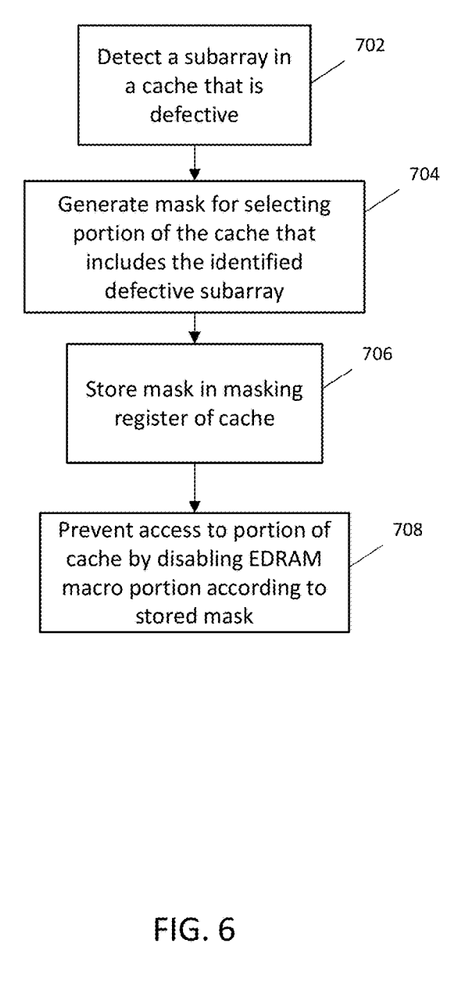
FIG. 6 depicts a flowchart for disabling a portion of a cache according to one or more embodiments of the present invention.

FIG. 6 depicts a flowchart of a method for disabling a portion of a cache according to one or more embodiments of the present invention. The method includes detecting a defective subarray within the cache portion 200, at block 702. The defect can be a correctable or an uncorrectable error. As described earlier, the detection can be performed using one of the known techniques or any other technique. The method further includes generating a mask for a portion of a cache bank that includes the defective subarray, at block 704. The mask is a bit pattern that identifies the portion of the cache bank. For example, the mask includes the bits C(0), RA(2). The mask facilitates identifying/selecting a set of compartments within the portion of a cache bank with the defective subarray, the compartments spanning the defective subarray.

The mask is stored in the cache array mask register 231, at block 706. The cache controller 203 uses the stored mask to prevent access to the portion of the cache bank, at block 708. The access is prevented by disabling a portion of the EDRAM macros corresponding to the stored mask. The corresponding set of EDRAM macros is disabled logically, rather than physically, through the LRU selection logic 232.

Figure 7:
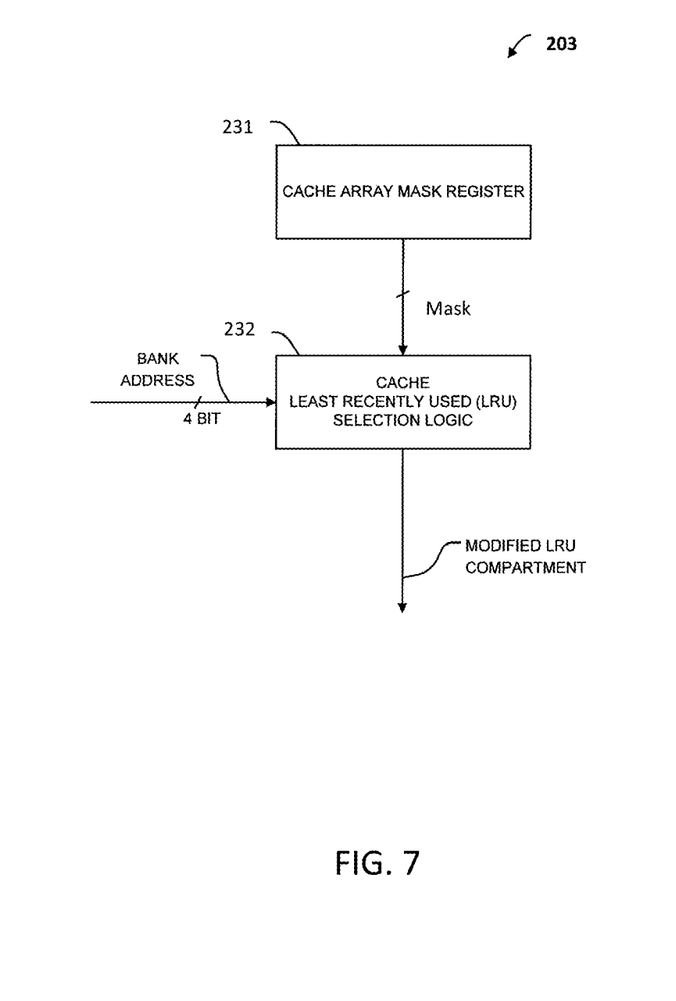
FIG. 7 depicts a cache selection system including EDRAM macro disablement according to one or more embodiments of the present invention.

FIG. 7 depicts a cache selection system including EDRAM macro disablement according to one or more embodiments of the present invention. The cache selection can be performed by the cache controller 203 using the cache array mask register 231 and the LRU selection logic 232. The cache array mask register 231 is programmable and to store a predetermined number of bits (e.g. eight (8) bits) corresponding to subarray groupings of EDRAM macros within two cache banks. The stored bits are passed to the LRU selection logic 232 as the logical mask. The logical mask selects one or more subarrays of EDRAM macros for disablement through the LRU selection logic 232.

The LRU selection logic 232 may apply/interpret the logical mask and may disable one or more subarrays of EDRAM macros based on the interpretation. For example, if a bit of the logical mask is set to a logical "1", subarray groupings within the EDRAM macros corresponding to that bit are disabled.

Accordingly, the corresponding EDRAM macros are disabled logically, rather than physically, through the LRU selection logic 232. For example, the LRU selection logic 232 encodes the logical mask provided by the cache array mask register 231 into a vector, such as a 16-bit vector that corresponds to 16 of 32 compartments, i.e. compartments 0-15 or 16-31. The 16-bit vector is compared to a compartment ID of a line to potentially be installed/written. If the compartment matches a bank address containing EDRAM macros subarrays identified in the logical mask, a modified LRU selection address is output, which does not include the identified EDRAM macros subarrays. Therefore, as the macros are only logically disabled through the LRU selection logic 232, there is no prevention of read operations from the disabled row, only install/write operations. In this manner, operation of cache memory is not affected, and data previously stored in the disabled row may be accessed until it is fully ejected.

Once all data is read, moved, or purged from the disabled EDRAM macros subarrays through normal operation of the cache memory, the disabled EDRAM macros subarrays may remain disabled in all cycles where a corresponding bit of the logical mask remains set to a logical "1". It follows that several EDRAM macros may be disabled through implementation of several logical "1"s in the logical mask as long as all 32 compartments of a single bank are not disabled at the same time. Therefore, multiple bits of the cache array mask register may be set to circumvent multiple defects or to facilitate testing of the cache memory. It may be advantageous, however, for system performance reasons to limit the masking so that available cache capacity is maintained.

Figure 8:
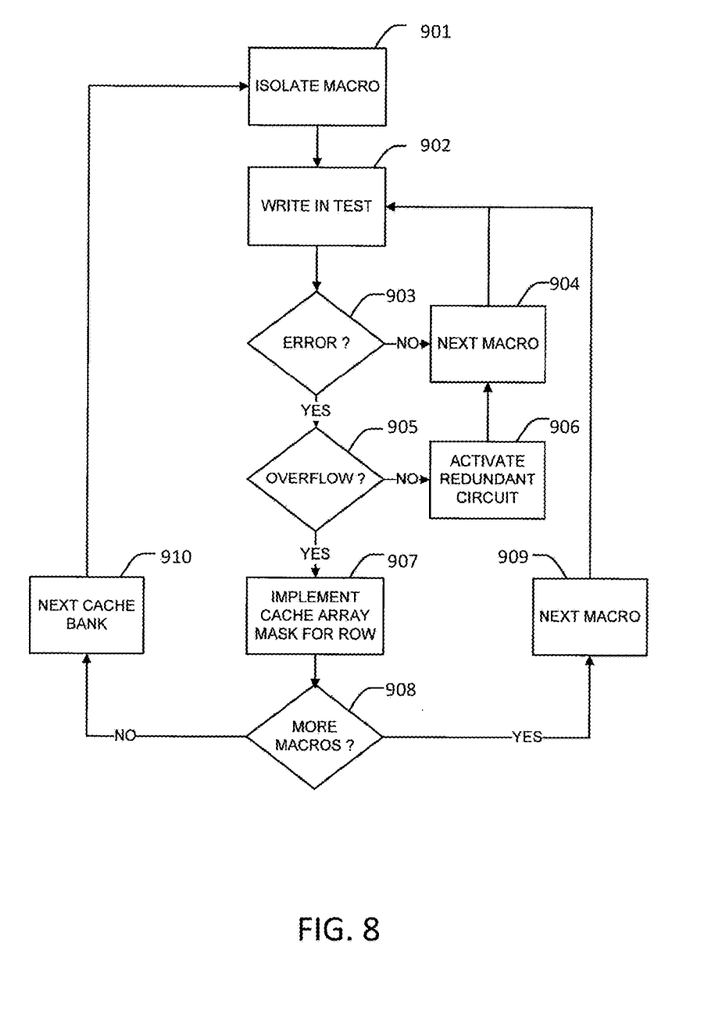
FIG. 8 depicts a method of EDRAM macro disablement according to one or more embodiments of the present invention.

FIG. 8 depicts a method of EDRAM macro disablement according to one or more embodiments of the present invention. The method includes isolating a portion of the cache bank that includes an EDRAM macro, which in turn includes a defective subarray, at block 901. For example, the EDRAM macro may be an EDRAM macro of the cache memory bank. The EDRAM macro may be one of EDRAM macros in the cache memory interleave 206.

Upon isolating the EDRAM macro, the method includes testing EDRAM macro write in, at block 902. For example, the EDRAM macro write in test may be an ABIST or other suitable test in which all lines are write in tested. The testing may include iterating through each line of an EDRAM macro to determine if there are defects within an EDRAM macro being tested. Defects may produce errors which may be handled as described below.

The method further includes determining if an error was detected, at block 903 (e.g., write in error). For example, an error may be an error which renders the currently tested EDRAM macro defective. If there is no error, the next EDRAM macro is selected, at block 904, and testing resumes at block 902. If there is an error, the method includes determining if there is an overflow, at block 905.

An overflow may be a situation where there are no redundancies for an EDRAM macro which may be arranged to perform for a defective portion or entirety of an EDRAM macro. If there is no overflow, the method includes activating a redundancy or redundant circuit, at block 906. Activating a redundancy may include arranging circuit paths to circumvent the defective portion of EDRAM macro. Thereafter, the next line or macro is selected, at block 904, and testing resumes, at block 902.

If there is an overflow, the method includes implementing a cache array mask corresponding to the defective EDRAM macro subarray, at block 907. For example, implementing the cache array mask may include setting a logical mask corresponding to bit values C(0), RA(2) at a cache array mask register corresponding to a portion in which the defective EDRAM macro subarray is located. These bits are passed within the logical mask to LRU selection logic within a cache memory control to render the corresponding cache portion non-writable or un-pickable. For example, this may be logical disablement of the portion containing the defective EDRAM macro subarray as described above, while still allowing any information of the EDRAM subarray macro to be read. As discussed above, the entire portion is disabled.

Upon implementation of the cache array mask for the row, the method includes determining if there are more EDRAM macros within the cache bank to be tested. If there are more EDRAM macros, the method includes selecting the next available EDRAM macro at block 909, and continuing testing at block 902. If there are no more EDRAM macros in the cache bank, the method includes selecting another cache bank to be tested at block 910, and the method continues at EDRAM macro isolation of an EDRAM macro of a new cache bank at block 901.

Figure 9:
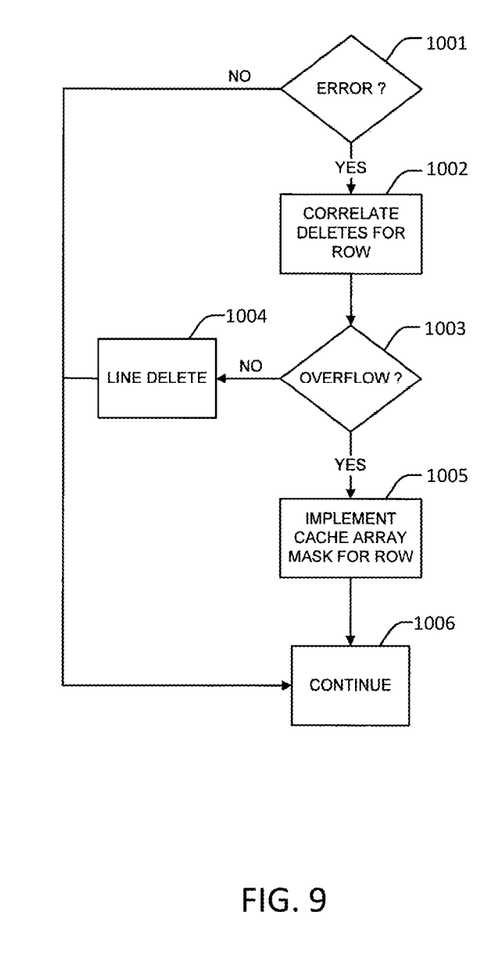
FIG. 9 depicts a dynamic method of EDRAM macro disablement according to one or more embodiments of the present invention.

FIG. 9 depicts a dynamic method of EDRAM macro disablement according to one or more embodiments of the present invention. The method includes determining if an error has occurred, or alternatively catching an error, at block 1001. For example, the error may be an error during the write in or read from an EDRAM macro 202. The error may be caught through a cache memory controller 203 configured to determine if an error has occurred. If an error is caught, the method includes correlating line deletes and/or errors across an entire portion associated with the error. For example, the error may originate from an EDRAM macro 202. The EDRAM macro 202 may be allocated to one of multiple rows of a cache memory bank 204. As errors from multiple different addresses accessing the same row are caught, the cache controller 203 may issue a line delete and re-attempt the write which caused the error. Each instance of a line delete may be stored for correlation, at block 1002. Therefore, if an EDRAM macro causes multiple errors, this information is available to the cache controller 203.

The method further includes determining if there is an error overflow, at block 1003. For example, an overflow may be a situation where the number of line deletes for a particular row or for a particular EDRAM macro 202 is above a predetermined or desired threshold. This may be determined using the information stored and referenced above. Absent an overflow, the method includes issuing a line delete, at block 1004 and continuing normal cache operation, at block 1006.

If there is an overflow, the method includes implementing a cache array mask corresponding to the overflow of errors, at block 1005. For example, implementing the cache array mask may include setting bit values for C(0), RA(2) within the logical mask at a cache array mask register 231. These bits are passed within the logical mask to LRU 232 selection logic within the cache memory controller 203 to render the corresponding portion non-writable or un-pickable. This may be logical disablement of a portion of the entire row originating the errors, while still allowing any information of the row to be read.

Upon implementation of the cache array mask for the row, the method includes continuing normal cache operation, at block 1006.

Accordingly, example embodiments of the present invention include methods of EDRAM macro disablement which include testing individual EDRAM macros in an iterative manner. However, EDRAM macro disablement may also be practiced in a dynamic manner during actual system use of a cache memory.

One or more embodiments of the present invention facilitate changes to EDRAM macro subarray groupings using two bits to select subarray grouping. This provides an ability to select a subarray with masking for a subarray failure. A predetermined address bit, such as bit 41, selects between upper and lower subarrays. Another address bit can be used to further select within a subarray grouping to reduce the cache area taken offline by the mask.

Accordingly, instead of masking 1/32nd of compartments, one or more embodiments of the present invention can mask 1/64th of the compartments (compared to existing solutions), which improves performance and allows masking of failures in subarrays.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source-code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for memory macro disablement in a cache memory, the computer-implemented method comprising:
   identifying a defective portion of a memory macro of a cache memory bank, the cache memory bank being divided into at least two rows of a plurality of memory macros, the memory macro being associated with one of the at least two rows;
   iteratively testing each line of the memory macro, the testing including attempting at least one write operation at each line of the memory macro;
   determining that an error occurred during the testing; and
   in response to determining the memory macro as being defective, disabling write operations for a portion of the memory macro by generating a logical mask that includes at least bits comprising a compartment bit, and read address bits, the logical mask identifies the portion to be disabled in the memory macro to be disabled.

2. The computer-implemented method of claim 1, wherein the testing is an Array Built-in Self-Test (ABIST).

3. The computer-implemented method of claim 1, further comprising:
   determining that an error overflow exists for the memory macro; and
   responsively activating a redundant circuit within the memory macro.

4. The computer-implemented method of claim 1, wherein disabling write operations further includes outputting the logical bit mask to least recently used (LRU) selection logic of the cache memory.

5. The computer-implemented method of claim 1, wherein the logical mask selects a half of the memory macro based on the compartment bit.

6. The computer-implemented method of claim 5, wherein one or more bits from the read address are used to select a subarray grouping within a subarray group in the selected half of the memory macro.

7. The computer-implemented method of claim 6, wherein a predetermined address bit selects a memory macro half within the selected subarray group.

8. A system for memory macro disablement in a cache memory, comprising:
   a cache memory bank, the cache memory bank being divided into multiple rows of a plurality of memory macros;
   a cache memory control unit in communication with the cache memory bank, the cache memory control unit including a cache array mask register and a least recently used (LRU) selection logic unit, the cache memory control unit configured to perform a method, comprising:
      identifying a defective portion of a memory macro of the cache memory bank;
      iteratively testing each line of the memory macro, the testing including attempting at least one write operation at each line in the memory macro;
      determining if an error occurred during the testing; and
      in response to determining the memory macro as being defective, disabling write operations for a portion of the memory macro by generating a logical mask that includes at least bits comprising a compartment bit, and read address bits, the logical mask identifies the portion to be disabled in the memory macro to be disabled.

9. The system of claim 8, wherein the testing is an Array Built-in Self-Test (ABIST).

10. The system of claim 8, wherein the method further comprises:
determining if an error overflow exists for the memory macro; and
responsively activating a redundant circuit within the memory macro.

11. The system of claim 8, wherein disabling write operations further includes outputting the logical mask to least recently used (LRU) selection logic of the cache memory.

12. The system of claim 8, wherein the logical mask selects a half of the cache memory bank based on the compartment bit.

13. The system of claim 12, wherein one or more bits from the read address are used to select a subarray grouping within a subarray group in the selected half of the cache memory bank.

14. The system of claim 13, wherein a predetermined address bit selects a memory macro half within the selected subarray group.

15. A computer program product for memory macro disablement in a cache memory, comprising a tangible computer readable storage medium readable by a processing circuit and storing instructions for execution by the processing circuit for performing a method comprising:
identifying a defective portion of a memory macro of a cache memory bank, the cache memory bank being divided into at least two rows of a plurality of memory macros, the memory macro being associated with one of the at least two rows;
iteratively testing each line of the memory macro, the testing including attempting at least one write operation at each line of the memory macro;
determining if an error occurred during the testing; and
in response to determining the memory macro as being defective, disabling write operations for a portion of the memory macro by generating a logical mask that includes at least bits comprising a compartment bit, and read address bits, the logical mask identifies the portion to be disabled in the memory macro to be disabled.

16. The computer program product of claim 15, wherein the method further comprises:
determining if an error overflow exists for memory macro; and
activating a redundant circuit within the memory macro based on the determining.

17. The computer program product of claim 15, wherein disabling write operations further includes outputting the logical bit mask to least recently used (LRU) selection logic of the cache memory.

18. The computer program product of claim 15, wherein the logical mask selects a half of the cache memory bank based on the compartment bit.

19. The computer program product of claim 18, wherein one or more bits from the read address are used to select a subarray grouping within a subarray group in the selected half of the cache memory bank.

20. The computer program product of claim 19, wherein a predetermined address bit selects a memory macro half within the selected subarray group.

21. The computer program product of claim 15, wherein the testing is an Array Built-in Self-Test (ABIST).

22. A system for memory macro disablement in a cache memory, comprising:
a cache memory bank, the cache memory bank being divided into multiple rows of a plurality of memory macros; and
a cache memory control unit in communication with the cache memory bank, the cache memory control unit including a cache array mask register and a least recently used (LRU) selection logic unit, the cache memory control unit configured to perform a method, comprising:
detecting a failure in a memory macro in the cache memory bank; and
in response to determining the memory macro as being defective, disabling write operations for a portion of the EDRAM macro by generating a logical mask to identify the portion that comprises at least: a compartment bit, and one or more read address bits.

23. The system of claim 22, wherein the logical mask is used to select a half of the cache memory bank based on the compartment bit, and to select a subarray group within the selected half of the cache memory bank based on the one or more predetermined address bits.

24. A computer-implemented method for memory macro disablement in a cache memory, the computer-implemented method comprising:
detecting a failure in a memory macro in a cache memory bank, the cache memory bank being divided into multiple rows of a plurality of memory macros; and
in response to determining the memory macro as being defective, disabling write operations for a portion of the memory macro by generating a logical mask that identifies the portion and that comprises at least: a compartment bit, and one or more read address bits.

25. The computer-implemented method of claim 24, wherein the logical mask is used to select a half of the cache memory bank based on the compartment bit, and to select a subarray group within the selected half of the cache memory bank based on the one or more predetermined address bits.

* * * * *